United States Patent
Sasaki et al.

[19]

[11] Patent Number: 5,994,771
[45] Date of Patent: Nov. 30, 1999

[54] SEMICONDUCTOR PACKAGE WITH MULTILAYER CIRCUIT, AND SEMICONDUCTOR DEVICE

[75] Inventors: Masayuki Sasaki; Takayoshi Hanabusa, both of Nagano, Japan

[73] Assignee: Shinko Electric Industries Co., Inc., Nagano, Japan

[21] Appl. No.: 08/875,484

[22] PCT Filed: Dec. 6, 1996

[86] PCT No.: PCT/JP96/03590

§ 371 Date: Jul. 29, 1997

§ 102(e) Date: Jul. 29, 1997

[87] PCT Pub. No.: WO97/22146

PCT Pub. Date: Jun. 19, 1997

[30] Foreign Application Priority Data

Dec. 8, 1995 [JP] Japan .................................... 7/320015

[51] Int. Cl.[6] .................................................. H01L 23/053
[52] U.S. Cl. ........................ 257/700; 257/701; 257/773
[58] Field of Search .................................. 257/700, 701, 257/774, 773, 678

[56] References Cited

U.S. PATENT DOCUMENTS

| | | | |
|---|---|---|---|
| 4,640,010 | 2/1987 | Brown ...................................... | 29/832 |
| 5,041,943 | 8/1991 | Ilardi et al. ............................. | 361/386 |
| 5,306,670 | 4/1994 | Mowatt et al. ......................... | 437/209 |
| 5,521,332 | 5/1996 | Shikata et al. .......................... | 257/700 |
| 5,828,126 | 10/1998 | Thomas .................................. | 257/700 |

FOREIGN PATENT DOCUMENTS

| | | |
|---|---|---|
| 0 276 345 | 8/1988 | European Pat. Off. . |
| 0 282 396 | 9/1988 | European Pat. Off. . |
| 0 526 992 | 2/1993 | European Pat. Off. . |
| 4-48793 | 2/1992 | Japan . |
| 6-181268 | 6/1994 | Japan . |
| 6-334067 | 12/1994 | Japan . |
| 7-169872 | 7/1995 | Japan . |

*Primary Examiner*—Carl Whitehead, Jr.
*Assistant Examiner*—Roy Potter
*Attorney, Agent, or Firm*—Pennie & Edmonds LLP

[57] ABSTRACT

To provide a semiconductor package on which a multilayer circuit is formed by a so-called build-up system, capable of assuredly mounting a semiconductor chip and improving the reliability of a semiconductor device yield, and durability. The semiconductor package includes an insulating core substrate 10 on one surface of which is defined a semiconductor chip mounting area 20 for mounting the semiconductor chip 14. A circuit pattern 12 made of a metallic foil is also formed on this surface so that one end thereof extends into the semiconductor chip mounting area 20. Film-like circuit patterns 22 connected to the circuit pattern are formed in a multi-layered manner via a film-like insulating layer 18 around the semiconductor chip mounting area on the core substrate. By these film-like circuit patterns and the film-like insulating layer, the semiconductor chip mounting area 20 is defined as a recess.

9 Claims, 3 Drawing Sheets

SEMICONDUCTOR PACKAGE WITH MULTILAYER CIRCUIT, AND SEMICONDUCTOR DEVICE

TECHNICAL FIELD

The present invention relates to a semiconductor package with a multilayer circuit, and a semiconductor device.

BACKGROUND ART

A semiconductor package (produced by a so-called build-up system) has been known in the prior art and is shown in FIG. 3. In the built-up system a film-like circuit pattern 22 is overlaid via a film-like insulation layer (resist) 18 on a core member 10 carrying a circuit pattern 12 made of metallic foil on the surface thereof, and electrically connected to the circuit pattern 12 on the core member 10 to form a multilayer circuit. The circuit pattern 12 provided on the surface of the core member 10 is made, for example, of copper foil. A solder resist 26 is coated on the upper surface of the uppermost film-like circuit pattern 22. A ball bump 30 is fixed to the circuit pattern 22 at a position where the solder resist 26 is partially removed. Thus, the semiconductor package is formed. A semiconductor chip 14 is fixed to the film-like circuit pattern 22 in the uppermost layer and connected to the multilayer circuit. Further, the semiconductor chip 14 or others are sealed by a potting substance (not shown) to form a semiconductor device.

According to the above semiconductor package, since the multilayer circuit is formed by using the film-like resist 18 and the film-like circuit pattern 22, it is possible to make the package very dense and miniaturize the circuits in response to the dense integration of the semiconductor chip 14.

However, when the semiconductor package is produced by the build-up system as described above, the bonding force between the coated resist 18 and the copper-plated film-like circuit pattern 22 is weak. That is, since the film-like circuit pattern 22 is merely overlaid with the resist 18, the bonding force is very weak and is, for example, in a range from 0.2 kg/cm to 0.3 kg/cm.

Accordingly, a bonding force is also weak between the ball bump 30 fixed on the surface of the film-like circuit pattern 22 and the resist 18. Since the semiconductor chip 14 is fixed to the uppermost film-like circuit pattern 22 via the ball bump 30, the semiconductor chip 14 cannot be assuredly fixed, with a high yield, to the semiconductor package and this results in a problem of lack of reliability and durability. For example, when the ball bump 30 is fixed, the film-like circuit pattern 22 may be peeled off or the semiconductor chip 14 may be released from the semiconductor package to disconnect the electric connection between the semiconductor chip 14 and the multilayer circuit.

Also, when the semiconductor chip is connected to the multilayer circuit of the semiconductor package by a wire bonding system, there is problem in that, if the bonding ability of the film-like circuit pattern 22 with the resist 18 is inferior, it is impossible to bond wires to the film-like circuit pattern 22 with a high yield to result in the deterioration of reliability and durability.

DISCLOSURE OF INVENTION

An object of the present invention is to assuredly fix a semiconductor chip to a semiconductor package formed by a so-called build-up system so that the yield and the durability of a semiconductor device thus obtained is improved.

To achieve this object, according to the present invention, a semiconductor package is provided which comprises an insulating core substrate defining a semiconductor chip mounting area on part of a first surface thereof, a circuit pattern formed on the first surface of the core substrate with a metallic foil so that one end of the circuit pattern extends into the semiconductor chip mounting area, and at least one film-like circuit pattern connected to the former circuit pattern and formed in an area around the semiconductor chip mounting area on the first surface of the core substrate via a film-like insulating layer, wherein the semiconductor chip mounting area is formed as a recess on the first surface of the core substrate with the film-like circuit pattern and the film-like insulating layer, and the interlayer electric connection is provided between the circuit pattern and the film-like circuit pattern, and between the film-like circuit patterns through via-holes.

The core substrate is preferably a glass fiber reinforced resin substrate. The circuit pattern may be formed by plating, vapor deposition or sputtering.

Preferably, a bump for connecting the semiconductor chip to the circuit pattern is formed on the circuit pattern extending into the semiconductor mounting area.

Preferably, a second circuit pattern made of metallic foil is formed on a second surface of the core substrate opposite to the first surface on which the semiconductor chip mounting area is defined, and electrically connected to the circuit pattern and/or the film-like circuit pattern via a through-hole provided in the core substrate; the second circuit pattern having an external terminal contact.

The present invention also provides a semiconductor device comprising a semiconductor package comprising an insulating core substrate defining a semiconductor chip mounting area on part of a first surface thereof, a circuit pattern formed on the first surface of the core substrate with a metallic foil so that one end of the circuit pattern extends into the semiconductor chip mounting area, and at least one film-like circuit pattern connected to the former circuit pattern and formed in an area around the semiconductor chip mounting area on the first surface of the core substrate via a film-like insulating layer, wherein the semiconductor chip mounting area is formed as a recess on the first surface of the core substrate with the film-like circuit pattern and the film-like insulating layer, and the interlayer electric connection is provided between the circuit pattern and the film-like circuit pattern, and between the film-like circuit patterns through via-holes; a semiconductor chip mounted onto the semiconductor chip mounting area of the semiconductor package to be connected to the one end of the circuit pattern; and a cap for covering the recess to seal the semiconductor chip.

Preferably, a mounting bump is formed in the external terminal contact. Also, a sealing resin may be filled into the recess.

According to the semiconductor package or the semiconductor device of the present invention, since the semiconductor chip is directly mounted onto the circuit pattern formed on the surface of the core substrate, it can be assuredly fixed to the semiconductor package to improve the reliability of the semiconductor device together with the yield and durability.

BEST MODE FOR CARRYING OUT THE INVENTION

The present invention will be described in detail below with reference to the preferred embodiments illustrated in the attached drawings.

Figure 1:
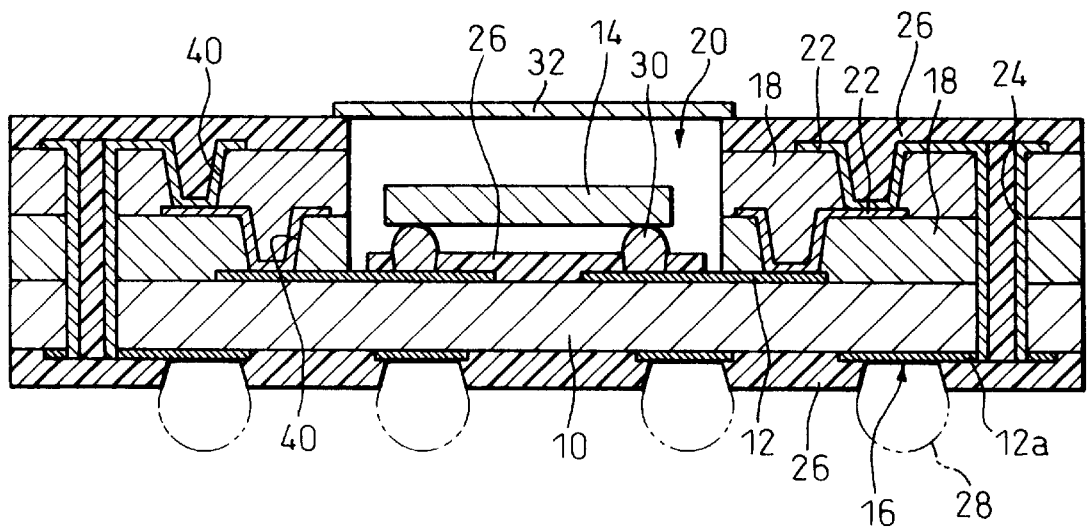
FIG. 1 is a schematic side sectional view of a main part of one embodiment of a semiconductor device according to the present invention.

FIG. 1 is a side sectional view of one embodiment of a semiconductor device according to the present invention.

An insulating core substrate 10 is, for example, a resin substrate reinforced with glass fibers (cloth). Such a glass cloth-reinforced resin substrate may be formed by impregnating glass fibers with epoxy resin used as an insulating material for a glass-epoxy substrate. Alternatively, a metal core substrate wherein a metallic substrate is covered with an insulating layer may be used as the core substrate 10.

A circuit pattern 12 is formed of a metallic foil such as a copper foil brought closely into contact with one surface of the core substrate 10. The circuit pattern 12 is placed on the surface of the core substrate 10 before the epoxy resin has been completely solidified during the production of the core substrate 10, and is then heated and pressed to the surface to be closely in contact therewith. A surface of the copper foil to be bonded to the core substrate 10 is roughened, for example, by the adjustment of conditions in an electroplating process for forming the copper foil (such as an electroplating density) so that surface irregularities are obtained. Thus, a bonding force of the circuit pattern 12 to the core substrate 10 is large, such as about 1.5 kgf/cm.

Also, the circuit pattern 12 is provided on both surfaces (upper and lower surfaces in the drawing) of the core substrate 10 as shown in the drawing. One end (inner end) of the circuit pattern 12 on the upper surface extends into a semiconductor chip mounting area 20 to be connected to a semiconductor chip 14. On the other hand, a part of the circuit pattern 12a provided on the lower surface defines an external terminal contact 16 to be connected to a mounted substrate. This external terminal contact 16 carries an external terminal such as a ball bump or a lead pin.

A film-like insulating layer 18 is provided by coating a resist material, such as epoxy resin which forms the insulating layer 18 after being solidified, around the outer periphery of the semiconductor chip mounting area 20 on the upper surface of the core substrate 10.

A film-like circuit pattern 22 is overlaid on the upper surface of the insulating layer 18 and connected to the circuit pattern 12. As shown in the drawing, the film-like circuit pattern 22 in the upper layer is connected to the circuit pattern 12a provided on the lower surface of the core substrate 10 via a through-hole 24 bored to communicate between the front and back sides of the semiconductor package.

The film-like circuit pattern 22 may be formed with a plated skin, a vapor deposition film or a sputtered film of copper or others. Of course, the insulating layer 18 and the film-like circuit pattern 22 may be alternately overlaid with each other to form a multilayer structure as shown in the drawing.

There are various methods for forming a multilayer circuit by overlaying the insulating layer 18 and the film-like circuit pattern 22 with each other, such as one using a photo-resist or one using a copper foil with resin. Ordinary steps thereof will be briefly described below.

When a photo-resist is used, the photo-resist is initially coated on a core substrate carrying a circuit pattern by a printing method or a spray method, then irradiated with light (exposed) and thereafter developed to form a pattern of via-holes 40. Also, it is possible to form a via-pattern by a laser. Next, copper plating is carried out on the surface of the core substrate to form a conductive layer, during which the copper layer is also formed on the inner wall of the via hole by the plating to complete the interlayer connection with the lower conductive layer (circuit pattern 12 or film-like circuit pattern 22). This structure corresponds to that of a recess or a V-shaped cross-sectional area formed in an end portion of the film-like circuit pattern 22. Thereafter, the surface conductive layer is etched to form a film-like circuit pattern 22. These steps are repeated to form a multilayer circuit.

On the other hand, when a copper foil with resin is used, the copper foil with resin is overlaid on a core substrate carrying a circuit pattern thereon. Then, a via pattern is formed on the copper foil through the exposure, development and etching processes. While using the copper foil as a mask, the resin is removed by a laser to form vias. Then, a conductive layer is formed by a copper plating on the surface, during which the copper is plated on the inner wall of the via-hole to complete the interlayer connection with the lower conductive layer (circuit pattern 12 or film-like circuit pattern 22). Thereafter, the conductive layer on the surface is etched to form a film-like circuit pattern 22. These steps are repeated to form a multilayer circuit.

As described above, the semiconductor chip mounting area 20 is formed on the core substrate 10 as a recess encircled by the film-like circuit pattern 22 and the insulating layer 18 overlaid thereon, and an end of the circuit pattern 12 extends into the recessed semiconductor chip mounting area 20.

A solder resist 26 is coated to form a layer on the outermost surfaces of both sides of the semiconductor package. That is, the solder resist 26 is coated onto the uppermost surface on which the insulating layer 18 and the film-like circuit pattern 22 are overlaid, the semiconductor chip mounting area 20 on which the semiconductor chip 14 is to be mounted and the lower surface of the core substrate 10.

A surface of the circuit pattern 12a exposed outside by partially removing the solder resist 26 from the lower surface of the core substrate 10 defines the external terminal contact 16. A mounting ball bump 28 which is one example of a bump may be formed in the external terminal contact 16. Alternatively, a lead pin or others may be provided in place of the mounting ball bump 28. As described above, since the external terminal contact 16 is formed as part of the circuit pattern 12a provided on the lower surface of the core substrate 10, a bonding force of the mounting ball bump or others with the core substrate 10 is high enough to reliably fix the same to the semiconductor package. Accordingly, the reliability of the semiconductor device relating to the mounting strength can be improved.

Also, a ball bump 30 is fixed to the surface of the circuit pattern 12 exposed outside by partially removing the solder resist 26 from the upper surface of the core substrate 10 in the semiconductor chip mounting area 20. This ball bump 30 is also directly fixed to the circuit pattern 12 in a manner similar to the mounting ball bump 28 or others. Thus, it is possible to reliably secure the ball bump 30 onto the semiconductor package.

A semiconductor device is produced by fixing a semiconductor chip 14 onto the semiconductor package thus prepared via the ball bump 30 and connecting the same to the film-like circuit pattern 22 (multilayer circuit) provided on the semiconductor package. The ball bump 30 may be made of solder and/or plated with gold. In such a manner, a flip-chip type semiconductor device wherein a semiconductor chip is mounted upside-down can be suitably produced. Since the ball bump 30 is reliably secured to the semiconductor package as described above, the semiconductor chip 14 is also reliably fixed to the semiconductor package. Accordingly, the semiconductor chip can be favorably mounted to the semiconductor package provided with a multilayer circuit formed by a so-called build-up system to improve the reliability of the semiconductor device thus obtained, such as yield or durability.

A cap 32 is provided for easily and reliably covering the semiconductor chip mounting area 20 in which the semiconductor chip 14 is mounted, so that the semiconductor chip 14 and a contact thereof with the circuit pattern 12 are suitably sealed. That is, since the semiconductor chip mounting area 20 is defined as a recess bordered with the peripheral zone consisting of the insulating layer 18 overlapped with the film-like circuit pattern 22, the same can be suitably covered with the cap 32. Thus, the sealability of the semiconductor chip can be facilitated because of the airtightness of the cap 32. In this regard, the cap 32 may be made of metal so that a projected portion is provided, which is adhered to a back surface of the semiconductor chip 14 to enhance the heat dissipation. Also, the recess may be filled with a sealing resin.

In the above-mentioned embodiment, the semiconductor chip 14 is mounted to the semiconductor package via the ball bumps 30 formed on the semiconductor package. However, the present invention is not limited thereto, but may be applied to the package device wherein the semiconductor chip 14 is connected to the circuit on the semiconductor package by a wire-bonding. When a portion to be wire-bonded is the circuit pattern 12 provided on the surface of the core substrate 10, it is possible to assuredly carry out the wire-bonding at a high yield and improve the reliability of the semiconductor device such as durability or others because of its sufficient bonding force.

Alternatively, it is also possible to provide ball bumps on the semiconductor chip 14, instead of the ball bumps 30 provided on the semiconductor package, and connect the semiconductor chip 14 to the circuit pattern 12, resulting in improved durability.

In the above embodiment, the film-like circuit pattern 22 and the film-like insulating layer 18 are overlaid with each other to form a multilayer structure, but may be of a single layer structure. In the latter case, the cap 32 for sealing the semiconductor chip 14 may be of a convex shape having a size capable of accommodating the semiconductor chip 14.

In the above embodiment, circuits are provided on one surface (upper surface) of the core substrate 10 by a so-called build-up system. However, the present invention, of course, should not be limited thereto, but may be applied to a semiconductor package wherein circuits are provided on both surfaces of the core substrate 10 by the build-up system unless there are problems, while providing the external terminal contact at another location.

Figure 2:
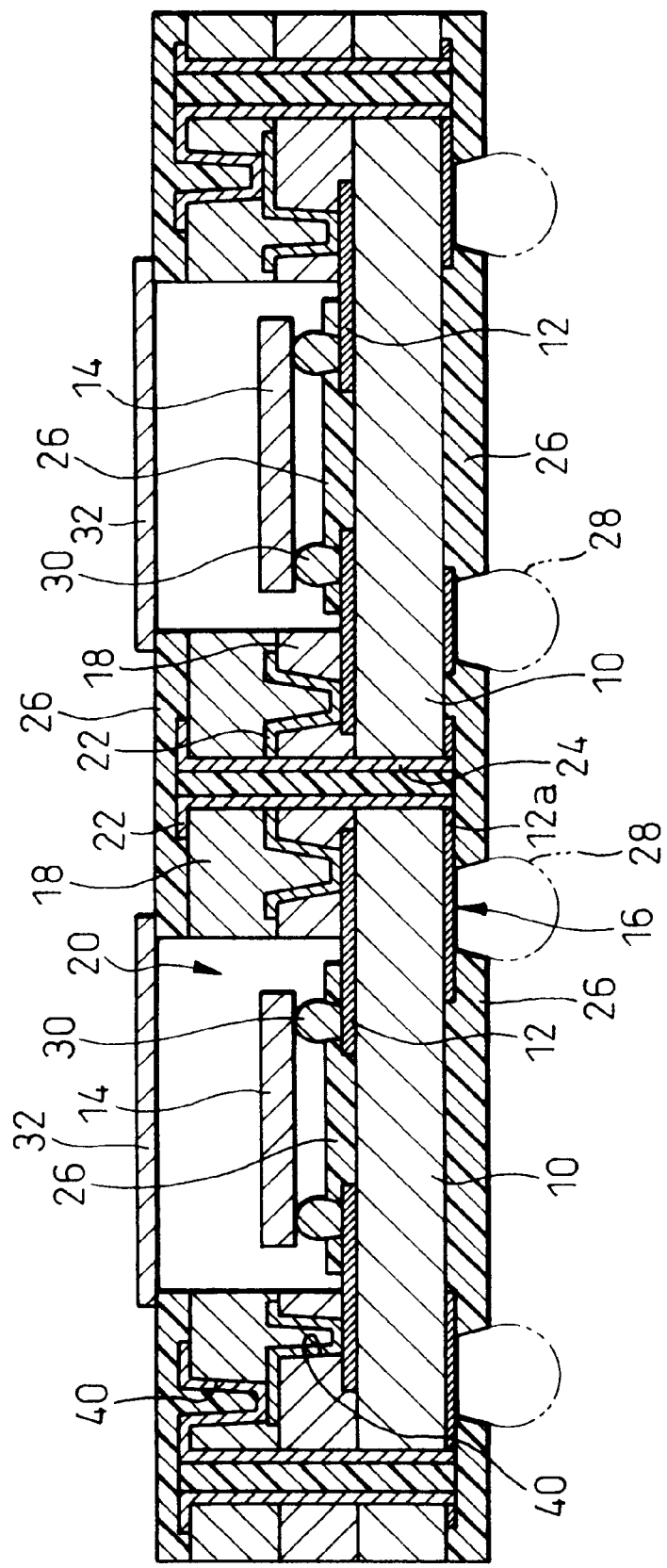
FIG. 2 is a schematic side sectional view of a main part of another embodiment of a semiconductor device according to the present invention.
Figure 3:
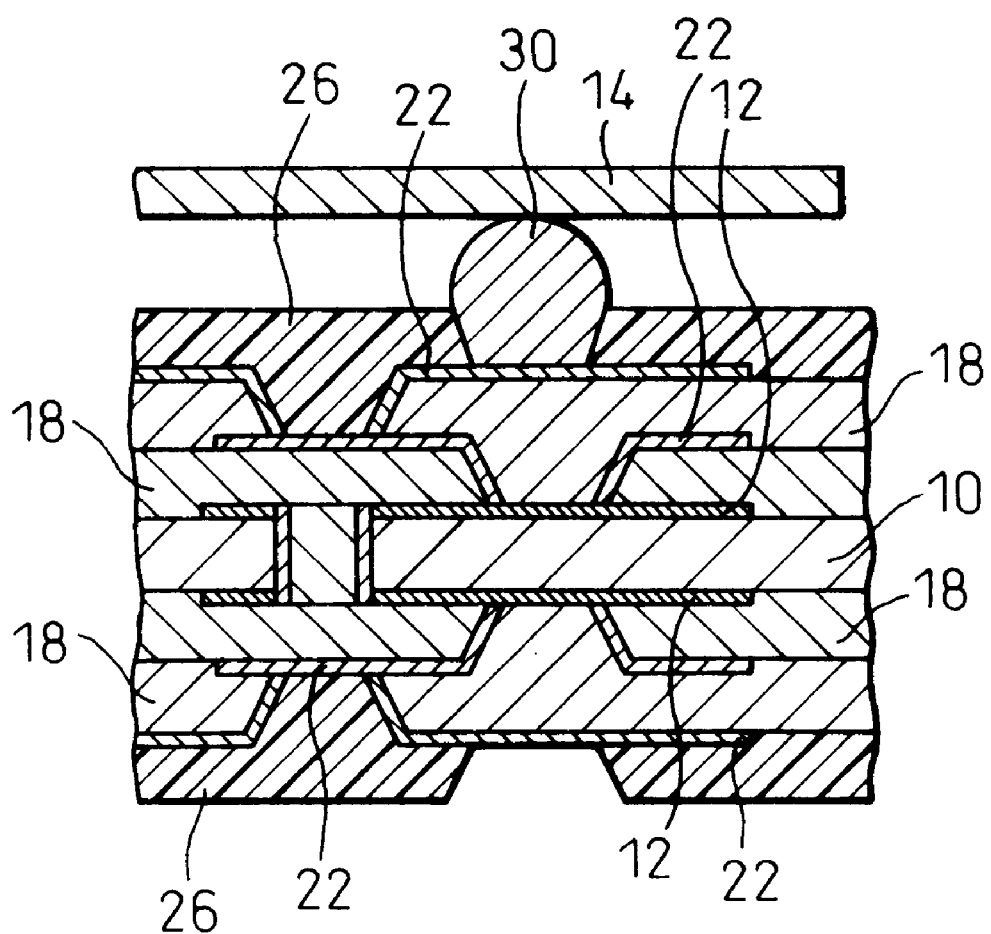
FIG. 3 is a side sectional view of the prior art device.

Also, the present invention is suitably applicable to a multi-chip type semiconductor device wherein a plurality of semiconductor chips are mounted onto a single substrate as shown in FIG. 2. According to the multi-chip type semiconductor device, semiconductor chips can be connected with each other in the inner layers of a semiconductor package, resulting in an improvement in characteristic of the semiconductor device. A structure regarding the respective semiconductor chip is the same as that of the embodiment shown in FIG. 1, and the description thereof will be eliminated, while, the Figure uses the same reference numerals for denoting the same parts.

The present invention was described in detail as above with reference to the preferred embodiments. However, the present invention should not be limited thereto, but includes various changes and modifications thereof without departing from the spirit of the present invention.

INDUSTRIAL APPLICABILITY

According to the present invention, it is possible to directly mount a semiconductor chip onto circuit patterns provided on a surface of a core substrate in a semiconductor package having a multilayer circuit formed by a so-called build-up system. Therefore, it is possible to assuredly fix the semiconductor chip to the semiconductor package to result in an improvement in the reliability yield, and durability of the semiconductor device thus obtained.

We claim:

1. A semiconductor package comprising an insulating core substrate defining a semiconductor chip mounting area on part of a first surface thereof, a first circuit pattern formed on the first surface of the core substrate with a metallic foil so that one end of the circuit pattern extends into the semiconductor chip mounting area, wherein a bump for connecting the semiconductor chip to said circuit pattern is formed on said end of the circuit pattern, and at least one film-like circuit pattern connected to the first circuit pattern and formed in an area around the semiconductor chip mounting area on the first surface of the core substrate via a film-like insultating layer, wherein the semiconductor chip mounting area is formed as a recess on the first surface of the core substrate with the film-like circuit pattern and the film-like insulating layer, and the interlayer electric connection is provided between the first circuit pattern and the film-like circuit pattern, and between the film-like circuit patterns through via-holes; said insulating core substrate additionally having a second surface formed opposite to said first surface, said second surface having thereon a second circuit pattern made of metal foil and having an external terminal contact, wherein the second circuit pattern is electrically connected to the first circuit pattern and/or to the film-like circuit pattern via a through-hole provided through the core substrate and the insulating layer and wherein the through-hole is plated with a conductive layer.

2. A semiconductor package as defined by claim 1, wherein the film-like circuit pattern is a plated, vapor deposited, or sputtered film.

3. A semiconductor package comprising an insulating core substrate of a glass fiber reinforced resin substrate defining a semiconductor chip mounting area on part of a first surface thereof, a first circuit pattern formed on the first surface of the core substrate with a metallic foil so that one end of the circuit pattern extends into the semiconductor chip mounting area, and at least one film-like circuit pattern connected to the first circuit pattern and formed in an area around the semiconductor chip mounting area on the first surface of the core substrate via a film-like insulating layer, wherein the semiconductor chip mounting area is formed as a recess on the first surface of the core substrate with the film-like circuit pattern and the film-like insulating layer, and the interlayer electric connection is provided between the first circuit pattern and the film-like circuit pattern, and between the film-like circuit patterns through via-holes.

4. A semiconductor device a semiconductor package comprising an insulating core substrate formed of glass fiber reinforced resin, said insulating core substrate defining a semiconductor chip mounting area on part of a first surface thereof, a first circuit pattern formed on the first surface of the core substrate with a metallic foil so that one end of the circuit pattern extends into the semiconductor chip mounting area, wherein a bump for connecting the semiconductor chip to said circuit pattern is formed on said first circuit pattern, and at least one film-like circuit pattern connected to the first circuit pattern and formed in an area around the semiconductor chip mounting area on the first surface of the core substrate via a film-like insulating layer, wherein the semiconductor chip mounting area is formed as a recess on the first surface of the core substrate with the film-like circuit pattern and the film-like insulating layer, and the interlayer electric connection is provided between the first circuit pattern and the film-like circuit pattern, and between the film-like circuit patterns through via-holes; a semiconductor chip mounted onto the semiconductor chip mounting area of the semiconductor package to be connected to the one end of the first circuit pattern; and a cap for covering the recess to seal the semiconductor chip.

5. A semiconductor device as defined by claim 4, wherein the film-like circuit pattern is a plated, vapor deposited, or sputtered film.

6. A semiconductor device as defined by claim 4, wherein a second circuit pattern made of metallic foil is formed on a second surface of the core substrate opposite to the first surface on which the semiconductor chip mounting area is defined, and is electrically connected to the circuit pattern and/or the film-like circuit pattern via a through-hole provided in the core substrate; the second circuit pattern having an external terminal contact.

7. A semiconductor device as defined by claim 6, wherein a mounting bump is formed in the external terminal contact.

8. A semiconductor device comprising a semiconductor package comprising an insulating core substrate defining a semiconductor chip mounting area on part of a first surface thereof, a first circuit pattern formed on the first surface of the core substrate with a metallic foil so that one end of the circuit pattern extends into the semiconductor chip mounting area, and at least one film-like circuit pattern connected to said first circuit pattern and formed in an area around the semiconductor chip mounting area on the first surface of the core substrate via a film-like insulating layer, wherein the semiconductor chip mounting area is formed as a recess on the first surface of the core substrate with the film-like circuit pattern and the film-like insulating layer, and the interlayer electric connection is provided between said first circuit pattern and the film-like circuit pattern, and between the film-like circuit patterns through via-holes; a semiconductor chip mounted onto the semiconductor chip mounting area of the semiconductor package to be connected to the one end of the circuit pattern; and a cap for covering the recess to seal the semiconductor chip, wherein a sealing resin is filled into the recessed semiconductor chip mounting area.

9. A semiconductor device comprising a semiconductor package comprising an insulating core substrate formed of glass fiber reinforced resin, said insulating core substrate defining a semiconductor chip mounting area on part of a first surface thereof, a first circuit pattern formed on the first surface of the core substrate with a metallic foil so that one end of the circuit pattern extends into the semiconductor chip mounting area, wherein a bump for connecting the semiconductor chip to said circuit pattern is formed on said first circuit pattern, and at least one film-like circuit pattern connected to the first circuit pattern and formed in an area around the semiconductor chip mounting area is formed the first surface to the core substrate via a film-like insulating layer, wherein the semiconductor chip mounting area is formed as a recess on the first surface of the core substrate with the film-like circuit pattern and the film-like insulating layer, and the interlayer electric connection is provided between the first circuit pattern and the film-like circuit pattern through via-holes; a semiconductor chip mounted onto the semiconductor chip mounting area of the semiconductor package to be connected to the one end of the first circuit pattern; and a cap for covering the recess to seal the semiconductor chip, wherein said insulating core substrate is additionally provided with a second surface formed opposite said first surface, said second surface having thereon a second circuit pattern made of metal foil and having an external terminal contact, wherein the second circuit pattern is electrically connected to the first circuit pattern and/or to the film-like circuit pattern via a through hole provided through the core substrate and the insulating layer, and wherein the through hole is plated with a conductive layer.

* * * * *